United States Patent [19]
Ebneter

[11] Patent Number: 4,736,172
[45] Date of Patent: Apr. 5, 1988

[54] TRANSDUCER FOR SAW ARRANGEMENTS

[75] Inventor: Josef Ebneter, Zurich, Switzerland

[73] Assignee: Siemens Aktiengesellschaft, Berlin and Munich, Fed. Rep. of Germany

[21] Appl. No.: 865,559

[22] PCT Filed: Sep. 2, 1985

[86] PCT No.: PCT/EP85/00477
§ 371 Date: May 2, 1986
§ 102(e) Date: May 2, 1986

[87] PCT Pub. No.: WO86/01655
PCT Pub. Date: Mar. 13, 1986

[30] Foreign Application Priority Data
Sep. 3, 1984 [CH] Switzerland .................. 04318/84

[51] Int. Cl.$^4$ ............... H03H 9/145; H03H 9/64; H03H 9/24
[52] U.S. Cl. ................... 333/193; 333/151; 333/154; 333/196; 310/313 B
[58] Field of Search ............... 333/150–155, 333/193–196; 310/313 R, 313 A, 313 B, 313 C, 313 D

[56] References Cited
U.S. PATENT DOCUMENTS
3,800,248 3/1974 Speiser et al. .................. 333/154
4,429,246 1/1984 Miyajima .................. 333/151 X
4,516,093 5/1985 Nyffeler .................. 333/154 X

OTHER PUBLICATIONS
Conference Proceedings–6th European Microwave Conference, Sep. 14–17, 1976, Rome, Italy–"Detailed Investigation on the Group-Type Unidirectional Interdigital SAW Transducer With its Application to Low Insertion Loss Surface Wave Filters", pp. 267–271.

Primary Examiner—Marvin L. Nussbaum
Attorney, Agent, or Firm—Hill, Van Santen, Steadman & Simpson

[57] ABSTRACT

In a directional transducer for SAW filters on a piezoelectric substrate, the transducer is formed of a plurality of groups which are connected in half-groups to busbars for two phases. The half-groups are alternately distributed into two or more channels such that the finger electrodes of each phase form a more or less gap-free series as viewed over all channels. A common, meandering busbar for both phases is associated with each channel.

14 Claims, 5 Drawing Sheets

TRANSDUCER FOR SAW ARRANGEMENTS

BACKGROUND OF THE INVENTION

The present invention relates to a transducer for a SAW arrangement wherein to provide unidirectional operation of the transducer, the transducer is formed of first and second interleaved sub-transducers respectively connecting to first and second phase voltages.

SAW (Surface Acoustic Waves) arrangements, particularly SAW filters, are electrical components which are based on the propagation of mechanical or acoustic waves in the surface of a piezo-electric substrate lamina. The conversion of electrical signals into surface acoustic waves and vice versa usually occurs by means of "interdigital transducers". In the simplest case, such transducers are composed of a series of thin metal strips vapor-deposited onto the substrate surface, these being referred to as finger electrodes and being interdigitally or alternatly connected to two busbars. When an alternating electrical voltage is applied to the busbar, a surface deformation of the substrate arises due to the piezoelectric effect, this deformation propagating as a mechanical wave in two opposite directions at right angles to the longest expanse of the finger electrodes. An electrical signal is again acquired from the mechanical surface wave by means of a further interdigital transducer. The transfer function of a SAW arrangement constructed in such a way can be largely prescribed by the geometry of the two transducers (i.e., by the plurality of finger electrodes, their lengths, widths, spacings, etc.). An optimally pronounced bandpass behavior is frequently strived for.

SAW arrangements having simple transducer types (referred to as bidirectional transducers) exhibit considerable losses, partially because the transmission transducer emits the surface waves in two opposite directions and because the reception transducer can output a maximum of one half of the incident energy to an electrical load. They also exhibit losses because the transducers dare not be optimally matched to the source or load since disturbing reflections (referred to as triple transit echoes) would otherwise occur within the transducer.

The described filter losses can be largely reduced when directional transducers are employed, these emitting the acoustic waves in the pass band in practically only one direction. Multiphase and group directional transducers (group type unidirectional transducer) have achieved practical significance. Multi-phase transducers are constructed in multilayer fashion and are therefore significantly more involved in terms of manufacture than a group type unidirectional transducer constructed in single-layer fashion.

Figure 2:
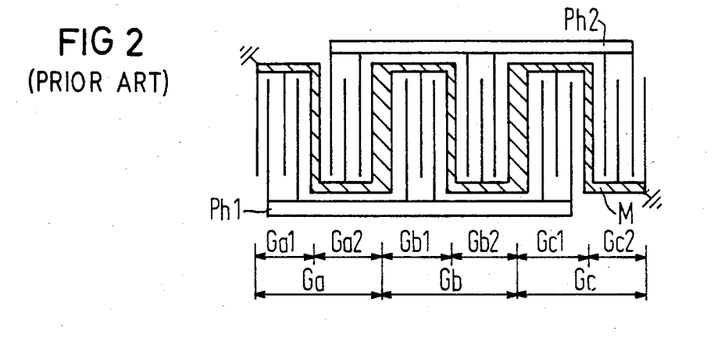
FIG. 2 shows a known prior art group type unidirectional transducer.

As FIG. 2 shows, the finger electrodes in group type unidirectional transducers are arranged in a number of groups Ga, Gb, Gc, .... Each individual group Ga, Gb ... is formed of two half-groups Ga1, Ga2; Gb1, Gb2; ... which are usually identical and which, as is known, are shifted by $n \cdot \lambda \pm \lambda/4$ relative to one another. Therein, n is a whole number and lambda is the wavelength at the synchronous frequency. This transducer has two busbars Ph1 and Ph2. A further, and in fact common, meandershaped busbar or ground wire M is provided, the path thereof in the transducer being such that this further busbar separates half-groups lying proximate to one another from one another, as shown in FIG. 2. Dependent upon affiliation to the left (Ga1, Gb1, ... ) or to the right (Ga2, Gb2, ... ) half-group, the "hot" finger electrodes of these half-groups are connected to one of the two busbars Ph1 or Ph2, respectively. Accordingly, the one phase of the electrical signal to be fed in is applied to the one busbar Ph1. The other phase of this signal is applied to the other busbar Ph2, whereby these two phases have a phase difference of 90° relative to one another at the synchronous frequency. A third phase, or a reference potential such as ground, is applied to the further busbar. Accordingly, the transducer can be thought of as being formed of two mutually interleaved sub-transducers, whereby the one sub-transducer comprises the half-groups Ga1, Gb1, Gc1, ... and the other subtransducer comprises the half-groups Ga2, Gb2, Gc2, ....

The directional effect of this directional transducer then arises since the waves of the two sub-transducers in the forward direction add up, whereas they cancel in the other direction. In the forward direction, the topical and chronological phase differences compensate; in the reverse direction, they add up to 180°. Such a directional transducer can be employed both as a transmission transducer as well as a reception transducer, and works nearly loss-free in both applications.

The above-described, known group type unidirectional transducer (FIG. 2) has two deficiencies associated therewith:

1. The ohmic resistance of the further busbar or ground wire M causes losses and a distortion of the frequency characteristic; and 2. Pronounced secondary lobes lie in or puncture the stop band.

SUMMARY OF THE INVENTION

An object of the invention is to specify a low-loss transducer of the directional transducer type which can be planarly (single-layer) constructed and which exhibits a pronounced bandpass behavior, and specifically without the secondary lobes typical of the known group type unidirectional transducer. This object is achieved according to the invention by providing first and second channels for the transducer, each channel being formed of first and second interleaved subtransducers. The two channels are arranged alongside and parallel to one another.

The new directional transducer is related to the group type unidirectional transducer. The invention is based on the perception that, within the propagation direction for the acoustic wave, i.e. perpendicular to the arrangement of the finger electrodes, the one sub-transducer is interrupted once or repeatedly by the other sub-transducer operated in hetero-phase fashion. An important idea of the present invention is comprised in having the sub-transducers of the two phases present in as complete and gap-free fashion as possible. For this purpose, it is provided in the invention that these sub-transducers or half-groups thereof be divided onto two or three (or even more) channels. Where one sub-transducer, for example, comprising the half-groups Ga1, Gb1, ..., is interrupted in the one channel in order to make room for a respective half-group (Ga2, Gb2, ...) of the hetero-phase sub-transducer, this one sub-transducer is continued in another channel and vice versa. Although the transfer functions of the individual channels (a plurality thereof in the invention) continue to have the secondary lobes in the stop band typical of group type unidirectional transducers, these lobes are largely completely cancelled given the summation of the waves over all channels of the transducer of the invention. The new directional transducer of the invention functions entirely correctly when the emitted acoustic waves are summed up over the entire aperture thereof, i.e. over all channels of the transducer. As is known, this can occur, for example, by means of what is referred to as a multi-strip coupler or by means of a non-overlap-weighted conventional transducer. For a transducer of the invention having the plurality k of channels (as, for example, the input transducer of the arrangement), a further possibility is to employ a plurality k of transducers (as, for example, the output transducer) which, however, are known transducers according, for example, to FIG. 2 (or even bidirectional transducers) having identical transfer functions (and connected in parallel).

Compared to known group type unidirectional transducers, secondary lobes which are already quite significantly weaker and narrower already derive given the embodiment of the invention comprising two channels. If these secondary lobes are to be completely suppressed given employment of only two channels, then three further techniques are available (a) an aperiodic structure of the further busbar or ground wire M (FIG. 3c); and/or (b) a differing size of the half-groups at the transmission transducer in comparison to the reception transducer (for example, one transducer of FIG. 3a and one transducer of FIG. 3b), so that the secondary lobes of the two transducers do not overlap at any frequency, or overlap considerably more seldom by comparison.

These two techniques a, b are also applied in conventional group type unidirectional transducers. When employed in a transducer of the invention, however, these techniques are substantially more efficient because the residual secondary lobes to be prevented are merely small.

A third technique is (c) to design a transducer of the invention having an appropriate number of channels in accordance with the known split finger principle, i.e. to design the afore-mentioned, individual finger electrodes only as split finger electrodes, whereby two isopolarized (parallel) finger electrodes (with width and finger clearance lambda/8) are provided instead of a respective finger electrode (with the width and the clearance lambda/4). Even given only two channels, moreover, a split finger execution of the invention supplies an almost optimum result and can, in particular, already be executed with a gap-free placement of the finger electrodes.

Figure 4:
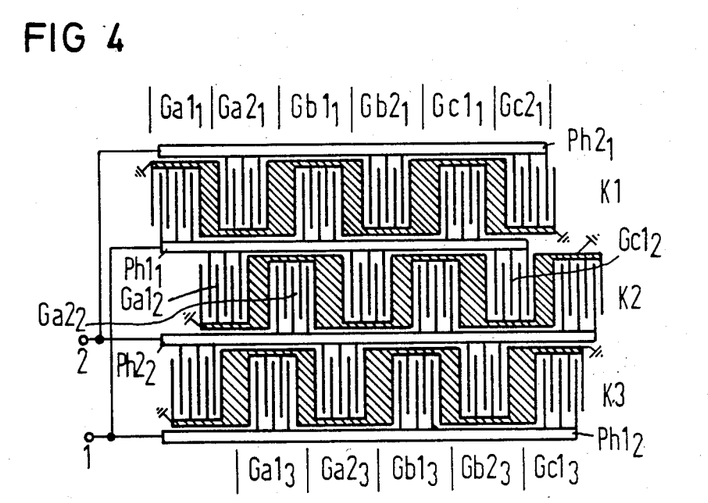
FIG. 4 shows a transducer of the invention comprising three channels.

Given three or more channels in accordance with the invention, the secondary lobes typical of known group type unidirectional transducers disappear without the techniques of a and b since the finger electrodes of both sub-transducers can be placed completely in a gap-free manner given such a plurality of channels. At least one "hot" finger (connected to one of the busbars Ph1 or Ph2) and a "cold" finger connected to the further busbar M is present per wavelength dimension for each phase Ph1 and Ph2. Despite gap-free placement of the finger electrodes, those portions of the further busbar M running parallel to the finger electrodes can thereby be broadened given three channels, as shown in FIG. 4.

In addition to the suppression of the secondary lobes, the new transducer has the advantage that the disturbing ohmic resistance of the further busbar or ground wire can be greatly reduced for the following reasons:

1. The further busbars (ground wires) M of the individual channels can (as the FIGS show) be connected parallel. Accordingly, the resultant resistance is reduced. Furthermore, the aperture (width) of the individual channels can be selected smaller (for reasons of impedance and space and without disadvantage) than in the traditional design comprising only one channel, so that the ohmic resistance can be further reduced.

2. In the conventional group type unidirectional transducer, the number of finger electrodes per half-group must be small so that the (frequency) spacings of the secondary lobes become as large as possible. This restriction does not exist given the new directional transducer of the invention. Larger groups can be allowed, so that the further busbar or ground wire M meanders less frequently, and therefore becomes shorter and is accordingly of lower impedance.

3. In the new transducer (at least given three or more channels), there is sufficient space between the half-groups for a great broadening of the further busbars or ground wires M (of the portions thereof proceeding parallel to the fingers), so that the electrical resistance can be further diminished.

The above statements shall now be explained in greater detail with reference to the drawing FIGURES. For reasons of clarity, the illustrated transducer structure has been shown schematically, and the scales differ in the x-direction and the y-direction.

DESCRIPTION OF THE PREFERRED EMBODIMENTS

Figure 1:
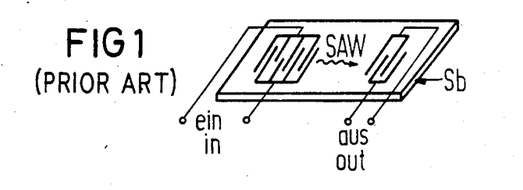
FIG. 1 shows an isometric illustration of a surface arrangement comprising two prior art type interdigital transducers.

FIG. 1 shows a SAW filter comprising a piezo-electric crystal or substrate Sb, and bidirectional transmission and reception transducers.

FIG. 2 shows the structure of a known group type unidirectional transducer comprising three groups Ga, Gb, and Gc. The group Ga is composed of the half-groups Ga1 and Ga2. The group Gb is composed of the half-groups Gb1 and Gb2, etc. The one sub-transducer with the busbar Ph1 thus comprises the half-groups Ga1, Gb1, and Gc1. The sub-transducer, fed in hetero-phase fashion and having the busbar Ph2, comprises the half-groups Ga2, Gb2, and Gc2. The further busbar or ground wire M is shown emphasized with hatching in the drawing figures.

Figure 3A:
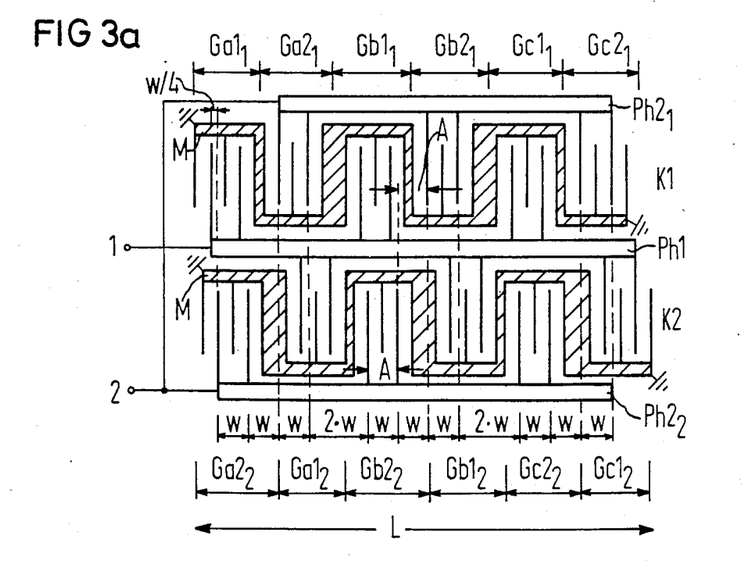
FIGS. 3a through c show embodiments of a transducer of the invention comprising two channels.

FIG. 3a shows the diagram of a directional transducer of the invention comprising two channels K1 and K2. Six half-groups are provided in each channel, namely $Ga1_1$, $Ga2_1$, $Gb1_1$, $Gb2_1$, $Gc1_1$, $Gc2_1$ in the channel K1 and $Ga2_2$, $Ga1_2$, $Gb2_2$, $Gb1_2$, $Gc2_2$, $Gc1_2$ in the channel K2. The 6 half-groups are combined in each channel with two "hot" finger electrodes each which, depending on the phase relation 1 or 2, are connected either to the middle busbar Ph1 or to one of the two outer (parallel) busbars $Ph2_1$, $Ph2_2$. For the respective phase 1, 2, the "hot" finger electrodes must lie on a grid having the line spacing 2, whereby w is the acoustic wavelength lambda at the synchronous or center frequency. Small deviations from this grid up to ±w/10 are possible. In case double or split finger electrodes are used, the middle of the two finger electrodes (lying at the same respective potential) must analogously lie on the respective grid.

With respect to the phase 2 (connected to the busbars $Ph2_1$ or $Ph2_2$), the transducer of the invention shown in FIG. 3a has a total of 12 "hot" finger electrodes and thereby has only two gaps (2.w) of only one finger electrode each, i.e. only one finger electrode is lacking there. In a directional transducer having only one channel (see FIG. 2), they would be gaps of three finger electrodes each. The two grids (one grid for each sub-transducer or each phase 1 and 2), are to be arranged shifted by a quarter wavelength, i.e. by w/4 as indicated, relative to one another.

Figure 3B:
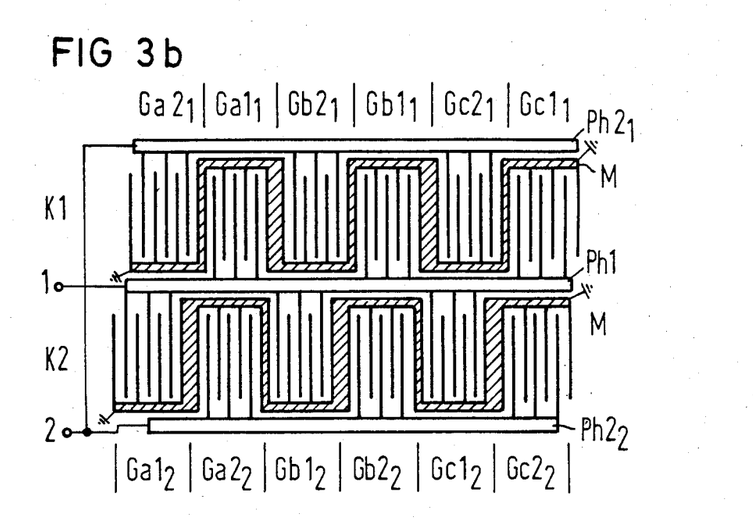
Figure 3C:
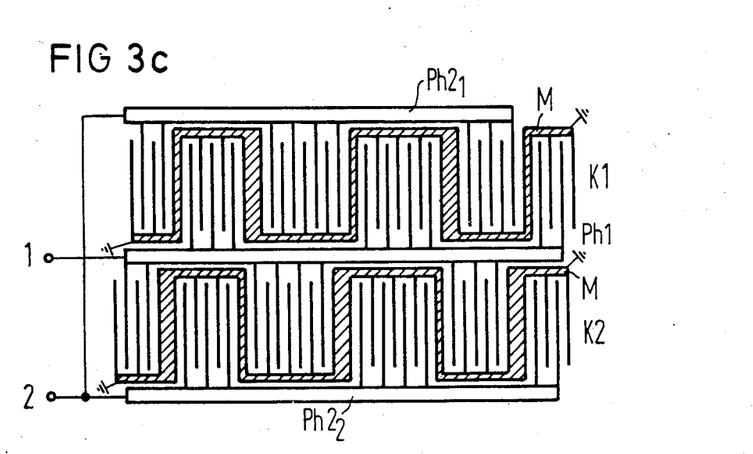

FIG. 3b shows a transducer comprising three respective "hot" finger electrodes per half-group $Ga1_1$, $Ga2_2$, $Ga2_1$, $Ga1_2$, ..., $Gb1_1$, ....

Dependent on the desired transducer characteristic, the number of groups Ga, Gb, Gc, ... as well as the number of finger electrodes per half-group $Ga1_a$, $Ga2_1$, ... can depart greatly from the examples shown in FIGS. 3 through 8. In particular, the number of finger electrodes per half-group within a transducer can vary, for example in order to suppress the residual secondary lobes given a 2-channel execution of a transducer of the invention. Such a transducer is shown in FIG. 3c. The sequence or the finger plurality of the "hot" finger electrodes is as follows in both channels: 2, 3, 4, 4, 3, 2. In order to also achieve a good directional effect when half-groups having a relatively large number of finger electrodes are employed (this diminishes the ohmic resistance of the further busbar M), it is beneficial to somewhat reduce the size of the groups toward the ends of the transducer, namely as in the numerical example of FIG 3c. Particularly low effective ohmic resistance, however, is obtained given a greater finger plurality of the half-groups at the ends, namely given a less frequent meandering there of the further busbar M. Weighing off the respective advantages against one another is to be recommended.

FIG. 4 shows a (likewise) unweighted directional transducer of the invention comprising three channels. As viewed over all three channels K1–K3, the two phases 1 and 2 here possess a gap-free series of "hot" finger electrodes with spacing lambda or w. When, as in FIG. 4, three respective "hot" finger electrodes have been selected per half-group, there is room between the half-groups for the respective, further busbar M having a width of 1x or 1.5x the wavelength lambda or the dimension 2, respectively. In a transducer comprising only two channels (FIGS. 3a through 3c), additional gaps derive insofar as such a width of the busbar M is prescribed. On a case-by-case basis, however, this can even be advantageous, because a periodicity having a doubled frequency thus derives in the transducer, this enlarging the relative spacings of the secondary lobes.

Figure 5:
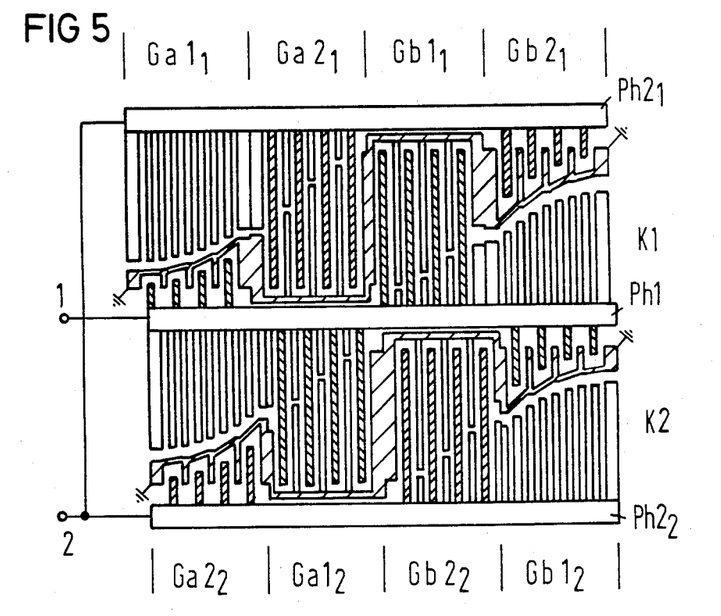
FIG. 5 shows a transducer of the invention in the embodiment comprising known finger overlap weighting.

FIG. 5 shows an example of a new transducer again comprising two channels which is overlap-weighted. As in conventional transducers, the overlap weighting (known per se) is employed to increase the general blocking selection of a filter. The weighting is usually executed roughly symmetrically relative to the middle of the transducer. The weighting shown in FIG. 5 wherein the smallest overlaps (within a channel) occur at diametrically opposite corners has the following advantages:

1. A uniform distribution of the acoustic energy over the full aperture of the channel; and 2. Given employment of a suitable (prescribed) weighting function, the sub-waves of each phase are of the same strength over the full transducer aperture (i.e. the same number of finger electrodes of both phases always participate in the generation or detection of the acoustic waves). This improves the directional effect of the transducer.

Figure 6:
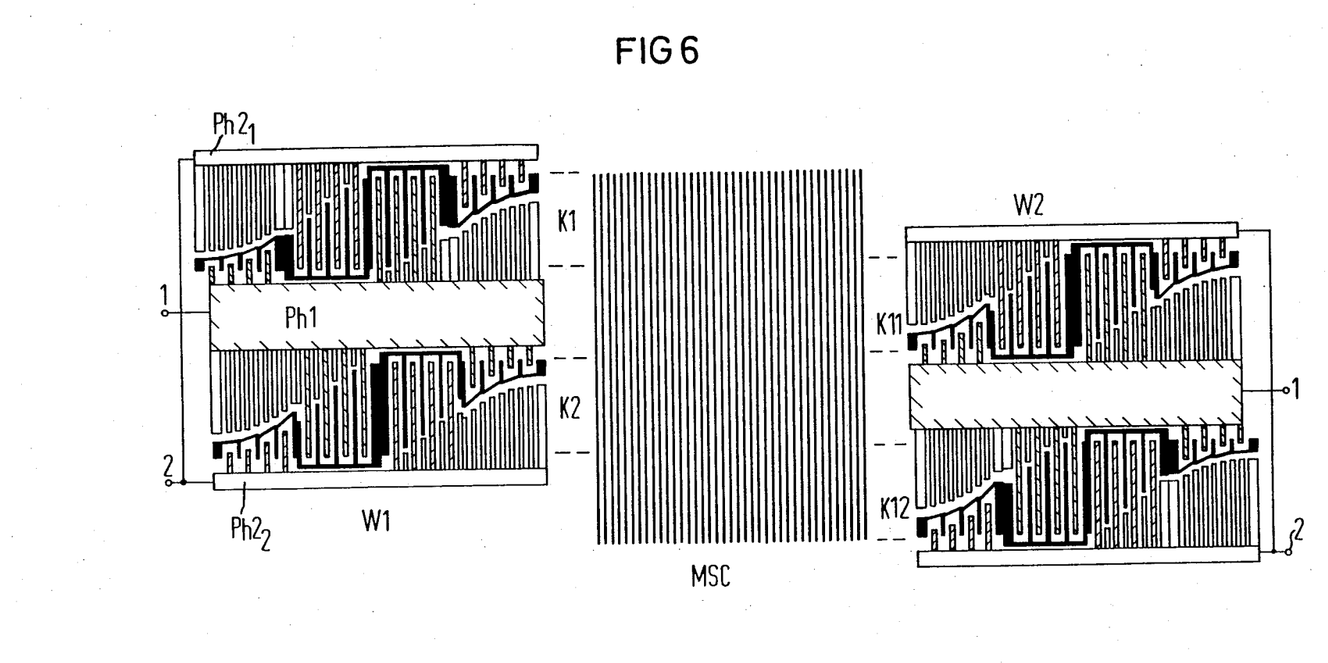
FIG. 6 shows a SAW filter comprising two transducers of the invention (with finger weighting) between which a multistrip coupler is arranged.

FIG. 6 shows a SAW filter comprising two overlap-weighted transducers of the invention and a multistrip coupler MSC. The multistrip coupler is composed of a plurality of parallel strips and has the job (in this application) of summing up the waves incident from the transmission transducer W1 onto the channels K1 and K2, and to send them to the reception transducer on the channels K11 and K12. By employing the multistrip coupler, the transmission transducer and the reception transducer can be constructed in accordance with the new principle. An offset of the input transducer relative to the output transducer is standard per se for a multistrip coupler. In FIG. 6, however, a special offset for the invention is provided, comprising the shown interleaving of the channels K1, K2 on the one hand and comprising the channels K11 and K12 on the other hand.

Figure 7:
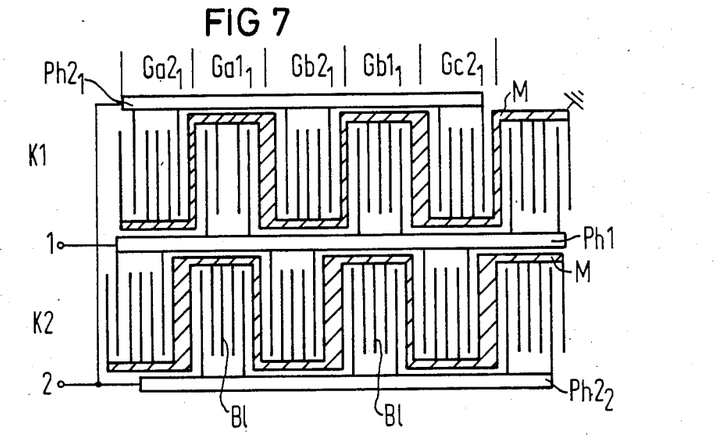
FIG. 7 shows a transducer with a finger gap corresponding to FIG. 3b.

FIG. 7 shows yet another embodiment of a transducer corresponding to FIG. 3b. In the half-groups of the one subtransducer therein, respectively one finger electrode (per half-group) is omitted as an active finger electrode in the periodic arrangement or sequence; this finger electrode is preferably fashioned as a blind finger (inactive). Such a finger is omitted in the half-group $Fa1_1$ so that the omission of an active finger electrode is likewise shown. The same thing is provided for the half-groups of the other of these two sub-transducers, namely again periodically for this sub-transducer. The period of the one sub-transducer is offset by lambda/4 relative to the period of the other sub-transducer, as corresponds to the mutual offset of the sub-transducers. Such a finger omission or the fashioning of such a finger as an inactive blind finger serves the purpose of impressing a further or different periodicity on the transducer.

Figure 8:
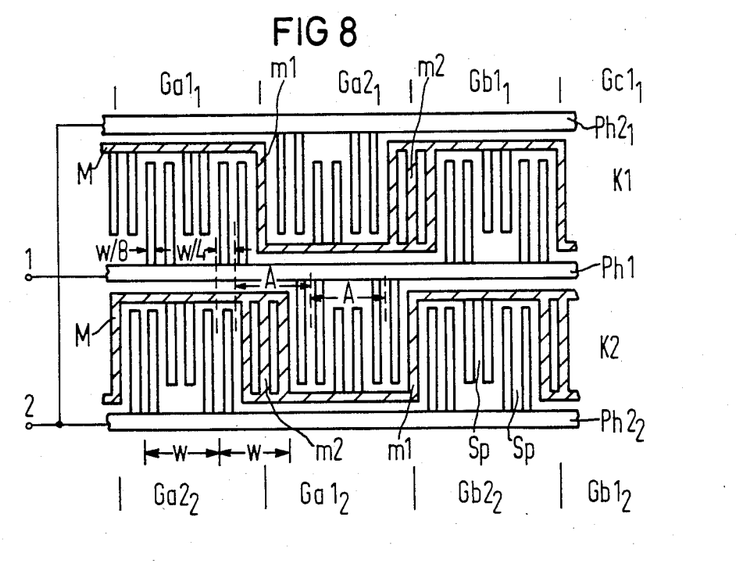
FIG. 8 shows a transducer of the invention with a split finger design.

FIG. 8 shows a split finger execution, again for only two channels for the sake of simplicity, whereby the application of split fingers, however already allows a nearly optimum result to be achieved given two channels. The individual split finger electrodes are referenced Sp.

A gap-free distribution of the finger electrodes is already achieved in a 2-channel execution when, as shown in FIG. 8, that portion of the further busbar M which proceeds parallel to the remaining finger electrodes is respectively executed at individual locations such that this portion has the shape or width of an individual finger m1, of a split finger pair, or is composed of three such individual fingers m2 lying next to one another. The two clearances present between three such "fingers" lying next to one another can also be filled out. This, however, would yield a slight irregularity for the wave propagation in the transducer.

Although various minor changes and modifications might be proposed by those skilled in the art, it will be understood that we wish to include within the claims of the patent warranted hereon all such changes and modifications as reasonably come within our contribution to the art.

We claim as our invention:

1. A group type unidirectional transducer for surface acoustic wave (SAW) filters, comprising:
   a substrate;
   first and second finger structure channels associated with the substrate;
   each finger structure channel having first finger electrodes connected to a first busbar, second finger electrodes connecting to a second busbar, a meander-shaped common busbar between the first and second busbars and having broadened portions running parallel to the finger electrodes, said broadened portions being broader than other portions of the common busbar, common finger electrodes connected to said common busbar, the first finger electrodes and some of the common finger electrodes being interdigitally positioned between one another to form a first sub-transducer, the second finger electrodes and other common finger electrodes being interdigitally positioned between one another to form a second sub-transducer, a first phase being connectable to the first busbar, a second phase being connectable to the second busbar, a reference potential being connectable to the common busbar, the first sub-transducer being formed of first half groups of the interidigitally positioned fingers and the second sub-transducer being formed of second half-groups of the interdigitally positioned fingers, and wherein the first half-groups of the first sub-transducer are arranged to alternately be interleaved with the second half-groups of the second sub-transducer and with a phase offset between the sub-transducers of $\pm\lambda/4$; and
   the first and second finger structure channels being arranged parallel and alongside one another and of approximately a same length L, and wherein the first half groups of the first channel are positioned adjacent gaps between first half groups of the second channel and second half groups of the first channel are positioned adjacent gaps between second half groups of the second channel.

2. A transducer according to claim 1 wherein at least some of the finger electrodes comprise split finger electrodes.

3. A transducer according to claim 1 wherein for at least one of the channels and at least one of the sub-transducers within that channel, a lateral center-to-center spacing in a wave propagation direction of the transducer of finger electrodes connected to the respective first or second busbar and known as "hot" finger electrodes has a dimension of at least two times a width of a finger electrode in the wave propagation direction.

4. A surface acoustic wave filter, comprising:
   first and second transducers associated with a substrate;
   a multi-strip coupler between the first and second transducers;
   each transducer comprising
   first and second finger structure channels;
   each finger structure channel having first finger electrodes connected to a first busbar, second finger electrodes connecting to a second busbar, a meander-shaped common busbar between the first and second busbars, common finger electrodes connected to said common busbar, the first finger electrodes and some of the common finger electrodes being interdigitally positioned between one another to form a first sub-transducer, the second finger electrodes and other common finger electrodes being interdigitally positioned between one another to form a second sub-transducer, a first phase being connectable to the first busbar, a second phase being connectable to the second busbar, a reference potential being connectable to the common busbar, the first sub-transducer being formed of first half groups of the interidigitally positioned fingers and the second sub-transducer being formed of second half-groups of the interdigitally positioned fingers, and wherein the first half-groups of the first sub-transducer are arranged to alternately be interleaved with the second half-groups of the second sub-transducer and with a phase offset between the sub-transducers of $\pm\lambda/4$, the first and second finger structure channels being arranged parallel and alongside one another and of approximately a same length L; and
   in a direction perpendicular to a wave propagation direction of the filter, one of the channels of the second transducer being on a line between the first and second channels of the first transducer.

5. A group type unidirectional transducer for surface acoustic wave (SAW) filters, comprising:
   a substrate;
   first and second finger structure channels associated with the substrate;
   each finger structure channel having first finger electrodes connected to a first busbar, second finger electrodes connecting to a second busbar, a meander-shaped common busbar between the first and second busbars, common finger electrodes connected to said common busbar, the first finger electrodes and some of the common finger electrodes being interdigitally positioned between one another to form a first sub-transducer, the second finger electrodes and other common finger electrodes being interdigitally positioned between one another to form a second sub-transducer, the first sub-transducer being formed of first half groups of the interdigitally positioned fingers and the second sub-transducer being formed of second half-groups of the interdigitally positioned fingers, and wherein the first half-groups of the first sub-transducer are arranged to alternately be interleaved with the second half-groups of the second sub-transducer; and
   the first and second finger structure channels being arranged parallel and alongside one another and with the first busbars being formed of a single busbar between the two channels.

6. A group type unidirectional transducer for surface acoustic wave (SAW) filters, comprising:

a substrate;

first and second finger structure channels associated with the substrate;

each finger structure channel having first finger electrodes connected to a first busbar, second finger electrodes connecting to a second busbar, a meander-shaped common busbar between the first and second busbars, common finger electrodes connected to said common busbar, the first finger electrodes and some of the common finger electrodes being interdigitally positioned between one another to form a first sub-transducer, the second finger electrodes and other common finger electrodes being interdigitally positioned between one another to form a second sub-transducer, a first phase being connectable to the first busbar, a second phase being connectable to the second busbar, a reference potential being connectable to the common busbar, the first sub-transducer being formed of first half groups of the interdigitally positioned fingers and the second sub-transducer being formed of second half-groups of the interdigitally positioned fingers, and wherein the first half-groups of the first sub-transducer are arranged to alternately be interleaved with the second half-groups of the second sub-transducer and with a phase offset between the sub-transducers of $\pm\lambda/4$;

the first and second finger structure channels being arranged parallel and alongside one another and of approximately a same length L, and wherein first half groups of the first channel are positioned adjacent gaps between first half groups of the second channel and second half groups of the first channel are positioned adjacent gaps between second half groups of the second channel; and the first busbar being common to both the first and second finger structure channels.

7. A group type unidirectional transducer for surface acoustic wave (SAW) fingers, comprising:

a substrate;

first and second finger structure channels associated with the substrate;

each finger structure channel having first finger electrodes connected to a first busbar, second finger electrodes connecting to a second busbar, a meander-shaped common busbar between the first and second busbars, common finger electrodes connected to said common busbar, the first finger electrodes and some of the common finger electrodes being interdigitally positioned between one another to form a first sub-transducer, the second finger electrodes and other common finger electrodes being interdigitally positioned between one another to form a second sub-transducer, a first phase being connectable to the first busbar, a second phase being connectable to the second busbar, a reference potential being connectable to the common busbar, the first sub-transducer being formed of first half groups of the interdigitally positioned fingers and the second sub-transducer being formed of second half-groups of the interdigitally positioned fingers, and wherein the first half-groups of the first sub-transducer are arranged to alternately be interleaved with the second half-groups of the second sub-transducer and with a phase offset between the sub-transducers of $\pm\lambda/4$;

the first and second finger structure channels being arranged parallel and alongside one another and of approximately a same length L, and wherein first half groups of the first channel are positioned adjacent gaps between first half groups of the first channel and second half groups of the first channel are positioned adjacent gaps between second half groups of the second channel; and for at least one of the sub-transducers in each of the channels two finger electrodes being connected to the respective first or second busbar and designated "hot" finger electrodes, and each "hot" finger electrode lying on a respective common imaginary line perpendicular to a wave propagation direction of the transducer so that each of the two "hot" finger electrodes of the one channel line up with each of the two hot finger electrodes of the other channel.

8. A group type unidirectional transducer for surface acoustic wave (SAW) filters, comprising:

a substrate;

first and second finger structure channels associated with the substrate;

each finger structure channel having first finger electrodes connected to a first busbar, second finger electrodes connecting to a second busbar, a meander-shaped common busbar between the first and second busbars, common finger electrodes connected to said common busbars, the first finger electrodes and some of the common finger electrodes being interdigitally positioned between one another to form a first sub-transducer, the second finger electrodes and other common finger electrodes being interdigitally positioned between one another to form a second sub-transducer, a first phase being connectable to the first busbar, a second phase being connectable to the second busbar, a reference potential being connectable to the common busbar, the first sub-transducer being formed of first half groups of the interdigitally positioned fingers and the second sub-transducer being formed of second half-groups of the interdigitally positioned fingers, and wherein the first half-groups of the first sub-transducer are arranged to alternately be interleaved with the second half-groups of the second sub-transducer and with a phase offset between the sub-transducers of $\pm\lambda/4$;

the first and second finger structure channels being arranged parallel and alongside one another and of approximately a same length L, and wherein first half groups of the first channel are positioned adjacent gaps between first half groups of the second channel and second half groups of the first channel are positioned adjacent gaps between second half groups of the second channel; and for at least one of the sub-transducers of at least one of the channels, a number of finger electrodes in each sub-group connecting to the first phase or second phase first or second busbar, and thus "hot" fingers, not being constant from half-group to half-group of said sub-transducer.

9. A transducer according to claim 8 wherein the number of "hot" finger electrodes in the sub-groups of the given sub-transducer decreases toward an end of the sub-transducer.

10. A transducer according to claim 8 wherein the number of "hot" finger electrodes of the given sub-transducer increases towards ends of the sub-transducer.

11. A group type unidirectional transducer for surface acoustic wave (SAW) filters, comprising:

a substrate;

first and second finger structure channels associated with the substrate;

each finger structure channel having first finger electrodes connected to a first busbar, second finger electrodes connecting to a second busbar, a meander-shaped common busbar between the first and second busbars, common finger electrodes connected to said common busbar, the first finger electrodes and some of the common finger electrodes being interdigitally positioned between one another to form a first sub-transducer, the second finger electrodes and other common finger electrodes being interdigitally positioned between one another to form a second sub-transducer, a first phase being connectable to the first busbar, a second phase being connectable to the second busbar, a reference potential being connectable to the common busbar, the first sub-transducer being formed of first half groups of the interdigitally positioned fingers and the second sub-transducer being formed of second half-groups of the interidigitally positioned fingers, and wherein the first half-groups of the first sub-transducer are arranged to alternately be interleaved with the second half-groups of the second sub-transducer and with a phase offset between the sub-transducers of $\pm\lambda/4$;

the first and second finger structure channels being arranged parallel and alongside one another and of approximately a same length L, and wherein first half groups of the first channel are positioned adjacent gaps between first half groups of the second channel and second half groups of the first channel are positioned adjacent gaps between second half groups of the second channel; and the transducer having an overlap weighting wherein fingers alongside of one another overlap such that a plurality of active finger overlaps for each and every phase fluctuates a maximum of $\pm 25\%$ over at least 80% of an aperture within each and every channel.

12. A group type unidirectional transducer for surface acoustic wave (SAW) filters, comprising:

a substrate;

first and second finger structure channels associated with the substrate;

each finger structure channel having first finger electrodes connected to a first busbar, second finger electrodes connecting to a second busbar, a meander-shaped common busbar between the first and second busbars, common finger electrodes connected to said common busbar, the first finger electrodes and some of the common finger electrodes being interidigitally positioned between one another to form a first sub-transducer, the second finger electrodes and other common finger electrodes being interdigitally positioned between one another to form a second sub-transducer, a first phase being connectable to the first busbar, a second phase being connectable to the second busbar, a reference potential being connectable to the common busbar, the first sub-transducer being formed of first half grops of the interdigitally positioned fingers and the second sub-transducer being formed of second half-groups of the interdigitally positioned fingers, and wherein the first half-groups of the first sub-transducer and arranged to alternately be interleaved with the second half-groups of the second sub-transducer and with a phase offset between the sub-transducers of $\pm\lambda/4$;

the first and second finger structure channels being arranged parallel and alongside one another and of approximately a same length L, and wherein first half groups of the first channel are positioned adjacent gaps between first half groups of the second channel and second half groups of the first channel are positioned adjacent gaps between second half groups of the second channel; and for most half-groups, one finger electrode being periodically omitted in a given one of the sub-transducers of a given channel, and a period of one sub-transducer relative to the other sub-transducer in the given channel having an offset of $\lambda/4$ relative to each other.

13. A group type unidirectional transducer for surface acoustic wave (SAW) filters, comprising:

a substrate;

first and second finger structure channels associated with the substrate;

each finger structure channel having first finger electrodes connected to a first busbar, second finger electrodes connecting to a second busbar, a meander-shaped common busbar between the first and second busbars, common finger electrodes connected to said common busbar, the first finger electrodes and some of the common finger electrodes being interdigitally positioned between one another to form a first sub-transducer, the second finger electrodes and other common finger electrodes being interdigitally positioned between one another to form a second sub-transducer, a first phase being connectable to the first busbar, a second phase being connectable to the second busbar, a reference potential being connectable to the common busbar, the first sub-transducer being formed of first half groups of the interdigitally positioned fingers and the second sub-transducer being formed of second half-groups of the interdigitally positioned fingers, and wherein the first half-groups of the first sub-transducer are arranged to alternately be interleaved with the second half-groups of the second sub-transducer and with a phase offset between the sub-transducers of $\pm\lambda/4$;

the first and second finger structure channels being arranged parallel and alongside one another and of approximately a same length L, and wherein first half groups of the first channel are positioned adjacent gaps between first half groups of the second channel and second half grops of the first channel are positioned ajacent gaps between second half groups of the second channel; and for at least one of the channels, the first phase being offset from the second phase by $\lambda/4$ and the first sub-transducer being positionally offset in a direction of wave travel relative to the second sub-transducer by $\lambda/4$.

14. A group type unidirectional transducer for surface acoustic wave (SAW) filters, comprising:

a substrate;

first and second finger structure channels associated with the substrate;

each finger structure channel having first finger electrodes connected to a first busbar, second finger electrodes connecting to a second busbar, a meander-shaped common busbar between the first and second busbars, common finger electrodes connected to said common busbar, the first finger electrodes and some of the common finger electrodes being interdigitally positioned between one another to form a first sub-transducer, the second finger electrodes and other common finger electrodes being interdigitally positioned between one another to form a second sub-transducer, a first phase being connectable to the first busbar, a second phase being connectable to the second busbar, a reference potential being connectable to the common busbar, the first sub-transducer being formed of first half groups of the interdigitally positioned fingers and the second sub-transducer being formed of second half-groups of the interdigitally positioned fingers, and wherein the first half-groups of the first sub-transducer are arranged to alternately be interleaved with the second half-groups of the second sub-transducer and with a phase offset between the sub-transducers of $\pm\lambda/4$;

the first and second finger structure channels being arranged parallel and alongside one another and of approximately a same length L, and wherein first half groups of the first channel are positioned adjacent gaps between first half groups of the second channel and second half groups of the first channel are positioned adjacent gaps between second half groups of the second channel; and one of the sub-transducers of each channel having for each of the first and second half-groups, hot fingers connecting to the respective first phase or second phase first or second busbar, and wherein all of the hot finger pairs for one of the first and second half groups of the first and second channels are spaced by a distance "W" and when plotted on a common line running in a wave propagation direction of the transducer directly follow one another in intervals of multiples of "W".

* * * * *